US010934632B2

(12) United States Patent
Vissie et al.

(10) Patent No.: US 10,934,632 B2
(45) Date of Patent: Mar. 2, 2021

(54) DEVICE FOR GROWING A FLAT SINGLE CRYSTAL FROM A SEED CRYSTAL IN A CRYSTALLISATION SOLUTION AND PROCESS FOR MANUFACTURING THIS SINGLE CRYSTAL

(71) Applicant: COMMISSARIAT À L'ÉNERGIE ATOMIQUE ET AUX ÉNERGIES ALTERNATIVES, Paris (FR)

(72) Inventors: Pascal Vissie, Montbazon (FR); Max Grosil, Monts (FR); Bruno Pintault, Monts (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 266 days.

(21) Appl. No.: 16/314,792

(22) PCT Filed: Jun. 30, 2017

(86) PCT No.: PCT/FR2017/051774
§ 371 (c)(1),
(2) Date: Jan. 2, 2019

(87) PCT Pub. No.: WO2018/007729
PCT Pub. Date: Jan. 11, 2018

(65) Prior Publication Data
US 2019/0249329 A1 Aug. 15, 2019

(30) Foreign Application Priority Data
Jul. 4, 2016 (FR) ...................................... 1656379

(51) Int. Cl.
*C30B 7/14* (2006.01)
*C30B 7/08* (2006.01)
(Continued)

(52) U.S. Cl.
CPC ................. *C30B 7/14* (2013.01); *C30B 7/08* (2013.01); *C30B 15/32* (2013.01); *C30B 29/14* (2013.01);
(Continued)

(58) Field of Classification Search
CPC .......... C30B 7/08; C30B 23/00; C30B 29/14; C30B 15/32; C30B 35/007; Y10T 117/10; Y10T 117/1024; Y10S 117/911
See application file for complete search history.

(56) References Cited

U.S. PATENT DOCUMENTS 5,904,772 A    5/1999   Montgomery et al.

FOREIGN PATENT DOCUMENTS

| CN | 103 541 007 A | 1/2014 |
| FR | 2764909 A1 | 7/1999 |

(Continued)

OTHER PUBLICATIONS

Zaitseva et al. "Rapid growth of large-scale (40-55 cm) KH2PO4 crystals" In: Journal of Crystal Growth, Jan. 28, 1997, vol. 180, No. 2, pp. 255-262.

(Continued)

*Primary Examiner* — Matthew J Song
(74) *Attorney, Agent, or Firm* — Pearne & Gordon LLP

(57) ABSTRACT

A device for growing a flat single crystal from a seed in a crystallization solution. A support element has a support face; a blocking element comprising a blocking face, positioned at a predefined distance from the support face to block the growth of the single crystal in a direction perpendicular to the support face; a seed protection member, configured to protect the seed during a crystallization solution treatment phase and to free a growth zone positioned between the support face and the blocking face during a rotation of the support element; the blocking element comprises a holding (Continued)

member that cooperates with the protection member, the holding member being movable between a first position where it holds the protection member against the support face during the treatment phase and a second position where the holding member is separated from the protection member and participates in the formation of the blocking face.

9 Claims, 4 Drawing Sheets

(51) Int. Cl.
     *C30B 29/14*        (2006.01)
     *C30B 15/32*        (2006.01)
     *C30B 35/00*        (2006.01)

(52) U.S. Cl.
     CPC ....... *C30B 35/007* (2013.01); *Y10T 117/1024* (2015.01)

(56) References Cited

FOREIGN PATENT DOCUMENTS

| | | |
|---|---|---|
| SU | 488 611 A1 | 10/1975 |
| WO | 99/09236 A1 | 2/1999 |

OTHER PUBLICATIONS

Preliminary French Search Report for FR1656379 dated Match 27, 2017.
International Search Report for PCT/FR2017/051774 dated Sep. 6, 2017.
Written Opinion for PCT/FR2017/051774 dated Sep. 6, 2017.
International Preliminary Report on Patentability for PCT/FR2017/051774 dated Mar. 7, 2018.

DEVICE FOR GROWING A FLAT SINGLE CRYSTAL FROM A SEED CRYSTAL IN A CRYSTALLISATION SOLUTION AND PROCESS FOR MANUFACTURING THIS SINGLE CRYSTAL

CROSS-REFERENCE TO RELATED APPLICATIONS

This is a National Stage application of PCT international application PCT/FR2017/051774, filed on Jun. 30, 2017, which claims the priority of French Patent Application No. 16 56379, filed Jul. 4, 2016, both of which are incorporated herein by reference in their entirety.

TECHNICAL FIELD

The present invention relates to the production of plate-shaped single crystals by growth in solution from a seed crystal.

The invention is in particular concerned with a growth device for growing a planar single crystal having a protective system for protecting the seed crystal.

STATE OF PRIOR ART

A single crystal can be obtained by crystal growth from a seed placed in an over-saturated solution of a salt having the same nature as the crystal.

This growth method can for example be used for making single crystals of potassium dihydrogen phosphate (KDP) or deuterated potassium dihydrogen phosphate (DKDP) having large dimensions, these single crystals being necessary for making some optical elements used in power lasers for inertial confinement fusion, in particular optical switches (as Pockels cells) or frequency converters (frequency doubler (SHG) or tripler (THG)).

At the end of the growth, a single crystal is obtained in which plates the orientation of which with respect to the crystal system depends on the use desired for the crystal (in Pockels cells, in a frequency doubler (SHG) or tripler (THG)) are cut.

The evolution of a crystal submerged in a solution depends on the saturation level of the solution. If the solution is over-saturated, that is the amount of dissolved salt is higher than the equilibrium amount, the crystal grows by consuming excess salt in the solution. The crystal growth rate depends on the over-saturation level of the solution, which can be controlled by lowering the solution temperature or evaporating the solvent. It also depends on the renewal of the solution boundary layer about the crystal. On the contrary, a crystal submerged in an under-saturated solution is dissolved until the amount of dissolved salt in the solution reaches the equilibrium amount. The crystal can thus fully disappear.

In known solution growth devices, the crystal growth is free and unconstrained. The crystal is developed in the over-saturated solution on the lower tray of a growth platform, which is simply or alternately rotating, to form a tetragonal prism on top of which a tetragonal pyramid is located.

For the rapid growth production in an over-saturated solution of very large crystals, of KDP or DKDP for example, the seed crystal (that is the initial crystal) is a cube of about 1 cm side which is submerged in an over-saturated solution of several hundreds of litres.

An external disturbance, such as vibrations, can cause multiple nucleations and the occurrence of many interferences.

To make the over-saturated solution more stable against external disturbances, prior to growth, an under-saturation treatment is made for several days, by raising the solution temperature above its equilibrium temperature. If the seed is in contact with the solution at that time, it is dissolved. If one waits for the solution temperature to be close to the equilibrium temperature to introduce the seed, the benefit of the under-saturation treatment is lost, because the disturbance created by introducing the seed is very likely to produce interference.

To solve this problem, from document [1], a growth device which is equipped with a seed protective system is known.

In FIG. 1, the growth device 1 described in document [1] of prior art includes an assembly (also called "growth platform") which is formed by a lower tray 4, having a support face for supporting the seed 5, an upper tray 6 and two pillars 7 (also called spacers), connecting both trays to each other and holding them at a fixed distance from each other. The platform is suspended in the vessel 2 by a hollow rotational shaft 8, which is used as an axis of rotation by the platform. The seed is bound in the centre of the lower tray 4 of the platform. A rod 9 is slidably mounted in the rotational shaft 8 and has, at its base, a recess forming a cavity 10 for accommodating the seed 5.

The growth device 1 is introduced in a growth vessel 2 and this vessel is then filled with a growth solution 3. Before filling the vessel with the growth solution 3, the rod 9 is lowered in contact with the lower tray 4. The seed 5 is enclosed in the cavity 10 created at the base of the rod 9. It is thus protected from the solution 3 during the steps of filling the vessel 2 by the solution 3 and during the steps of over-heating and filtering the solution 3 (under-saturation treatment), prior to seed growth. A growth solution 3 which is under-saturated is thus obtained.

To start seed growth, the rod 9 is lifted to contact the seed 5 with the under-saturated growth solution 3. The seed is slightly dissolved while the solution temperature is lowered until the desired over-saturation level of the solution is reached. Then, the seed volume increases in the over-saturated solution 3 to reach the dimensions and shape of the crystal 11 by consuming the compound dissolved in the solvent of the solution 3.

The base of the rod 9 is high enough not to impede the growth of the crystal 11. An O-ring 12, placed in a throat of the upper tray 6, provides sealing at the clearance between the axis of the shaft 8 and the rod 9.

Additionally, in order to improve production efficiency in terms of number of cut plates per unit crystal volume, it has been proposed to perform growth from a properly oriented seed and to constrain the crystal growth in some directions (document [2]).

The crystallographic orientation of the seed is chosen as a function of the optical element (Pockels cell, SHG or THG) desired to be cut in the crystal. In the case of Pockels cells, the crystallographic direction [001] of the KDP seed is perpendicular to the lower tray on which it is bound. In the case of a growth for cutting plates for SHG, the direction [001] forms an angle θ of about 41° with the normal to the plane of the lower tray 4 to which it is bound and the direction [110] is in the plane of the lower tray. Finally, for making plates for THG, the direction [001] forms an angle θ of about 59° with the normal to the plane of the lower tray 4 and the direction [100] is in the plane of the lower tray.

It is the upper tray 6 of the platform which constrains the crystal in a side growth as illustrated in FIGS. 2*a* to 2*c*. The growing crystal 11 is developed between the lower tray 4 and the upper tray 6 of the alternately rotating platform (FIG. 2*a*). In contact with the upper tray 6, the crystal cannot grow in the vertical direction and it continues its growth sideways (FIGS. 2*b* and 2*c*).

In this constrained growth process between the lower tray and the upper tray, the upper tray has to be planar. But, the use of a rod in which a cavity for protecting the seed is provided does not fulfil this requirement.

DISCLOSURE OF THE INVENTION

The main purpose of the invention is to solve the drawbacks of devices of prior art by providing a growth device which is equipped with a seed protective system and which can be used in a constrained growth process.

In this regard, the invention provides a growth device for growing a planar single crystal from a seed crystal in a crystallisation solution, said growth device comprising:
  a support element having a support face for supporting the seed crystal; and
  a blocking element comprising a blocking face, the blocking face being disposed at a predefined distance from the support face so as to block growth of the single crystal in a substantially perpendicular direction to the support face;
  the growth device being characterised in that it further comprises a protective member for protecting the seed crystal, configured to protect said seed from the crystallisation solution during a treatment phase of the crystallisation solution and to release a growth zone disposed between the support face and the blocking face upon rotating the support element;
  the blocking element further including a holding member cooperating with the protective member, said holding member being movable between a first position in which it holds the protective member against the support face during the treatment phase and a second position in which the holding member is separated from the protective member and aids in forming the blocking face.

Some preferred but not limiting aspects of the device according to the invention are the following ones:
  the support face and the blocking face are planar faces;
  the protective member is a hollow body defining an open cavity for covering the seed during the treatment phase; it can for example have a half-sphere or bell shape;
  the blocking element includes a planar body a surface of which defines the blocking face, this body having a through hole which delimits an opening in the blocking face and wherein the holding member slides between the first and second positions;
  the holding member is a rod an end of which is provided with a planar surface having a shape corresponding to that of the opening in the blocking face; the planar surface of the end is for, in the first position of the holding member, bearing against the protective member and, in the second position of the holding member, plugging the opening to form the blocking face;
  the protective member includes, on an external surface thereof, a flat forming a planar bearing surface against which the holding member bears in the first position;
  the support face and the blocking face are parallel to each other; that enables a plate-shaped single crystal to be obtained; the support element and the body of the blocking element are preferably trays (planar plates).

The invention also relates to a facility for growing in solution a single crystal, comprising a vessel for containing a crystallisation solution, a growth device as described above, disposed in the vessel, and means for rotating the device in the vessel. The rotational means are well known to those skilled in the art. The rotation, which is generally alternated in one direction and then in the other, is most often ensured by an electric motor whose speed acceleration and deceleration phases before rotation are programmed, with the same parameters in one direction and in the reverse direction.

The invention also relates to a method for manufacturing a single crystal by growth in solution from a seed crystal implemented using a facility as described above, the process comprising:
  fixing the seed crystal to the support face of the support element, the seed crystal being oriented according to the orientation of the desired single crystal;
  placing the protective member around the seed and holding it on the support face of the support element by pressing on the protective member through the holding member, which is placed in its first position;
  contacting the protective member with the crystallisation solution by dipping the device into the crystallisation solution;
  treating the crystallisation solution to obtain an under-saturated solution;
  contacting the seed with the under-saturated crystallisation solution by moving the holding member from its first position to its second position and rotating the device about an axis essentially perpendicular to the support face (this axis passing preferably through the holding member), moving of the holding element and rotating, which releases the protective member;
  modifying the temperature of the growth solution to obtain an over-saturated solution;
  growing the single crystal between the support face and the blocking face from the over-saturated solution, this growth being continued until a desired lateral growth is obtained;
  detaching the single crystal from the support face and the blocking face.

The step of treating the crystallisation solution to obtain an under-saturated solution is well known to those skilled in the art and is not described herein. It generally includes a step of over-heating, and possibly a step of filtering, the solution. It enables an under-saturation solution to be obtained which, after modifying the solution temperature, will be in over-saturation conditions conducive to single crystal growth.

Generally, the modification in the temperature of the growth solution to obtain an over-saturated solution will be a lowering of the temperature if the solubility, in the solvent of the crystallisation solution, of the material forming the crystal increases with an increasing temperature.

Preferably, dipping the device into the crystallisation solution is achieved by introducing the solution into the vessel containing the device; in other words, the device is introduced into the vessel before the solution.

The process according to the invention is applicable to any method for growing a crystal in solution. Advantageously, in the manufacturing process according to the invention, the single crystal is a single crystal of potassium dihydrogen phosphate (KDP) or deuterated potassium dihydrogen phosphate (DKDP).

The growth device according to the invention enables the problem of protecting the seed in a growth system between planar trays to produce plate-shaped crystals to be solved.

The particular design of the growth device according to the invention makes it possible in particular:
- to protect the seed by avoiding contact between the seed and the growth solution during the step of filling the growth vessel and the step of treating the crystallisation solution (during which the solution is prepared so as to obtain an under-saturated solution; this treatment step can comprise, in a known manner, an over-heating operation and possibly a filtration operation for the solution);
- to release the seed, prior to initiating the growth phase, without creating excessive disturbances of the under-saturated crystallisation solution; and
- to obtain a planar surface at the blocking face when the holding member is in its second position.

BRIEF DESCRIPTION OF THE DRAWINGS

The invention will be better understood and further advantages and features will appear upon reading the description that follows, given by way of non-limiting example, accompanied with the appended drawings in which.

DETAILED DISCLOSURE OF PARTICULAR EMBODIMENTS

Figure 1:
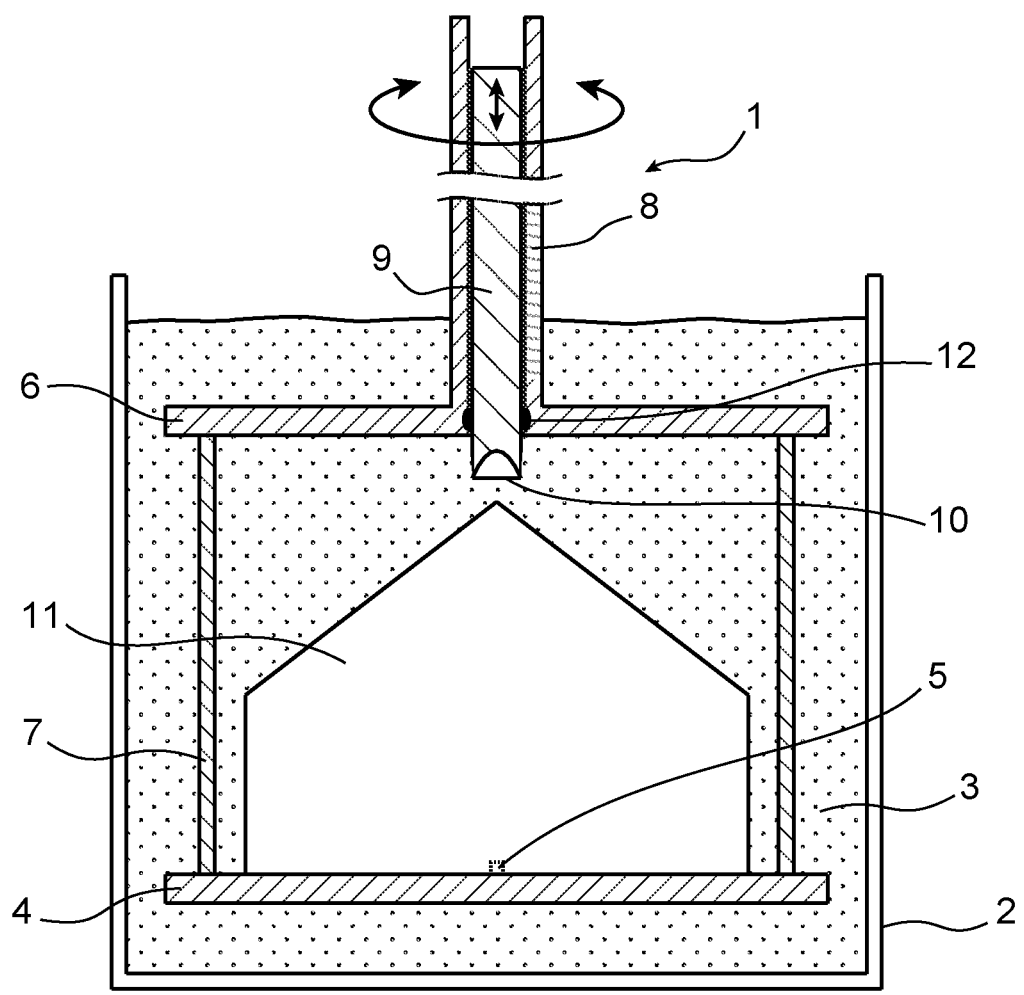
FIG. 1, already described, illustrates a known growth device used for performing rapid growth of a single crystal and having a known seed protective system.
Figure 2A:
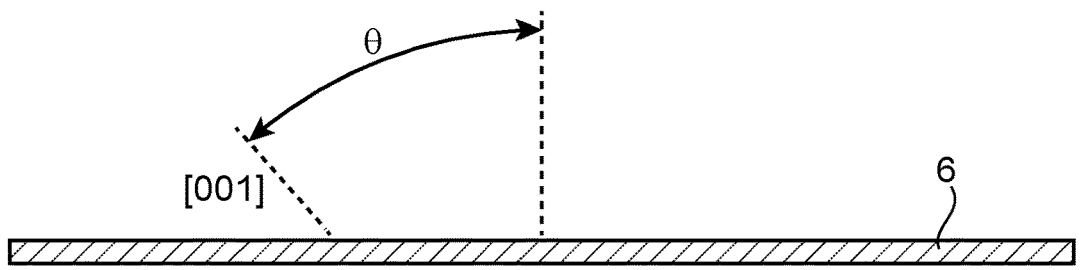
FIGS. 2a to 2c, already described, illustrate the constrained growth steps for a plate-shaped single crystal using a known constrained growth device.
Figure 2A:
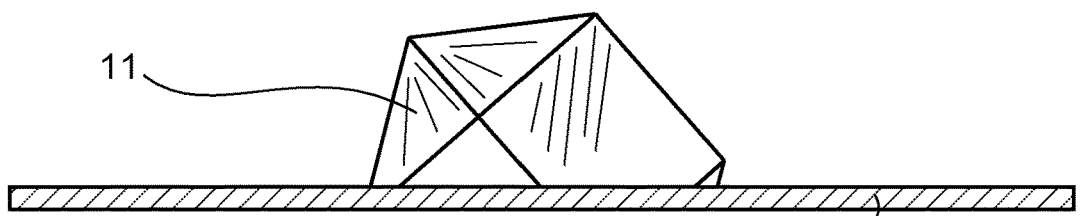
Figure 2B:
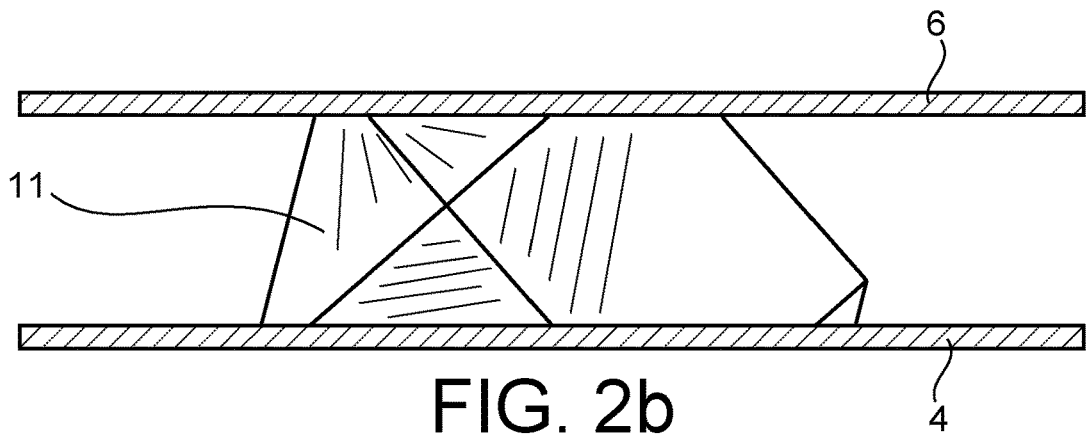
Figure 2C:
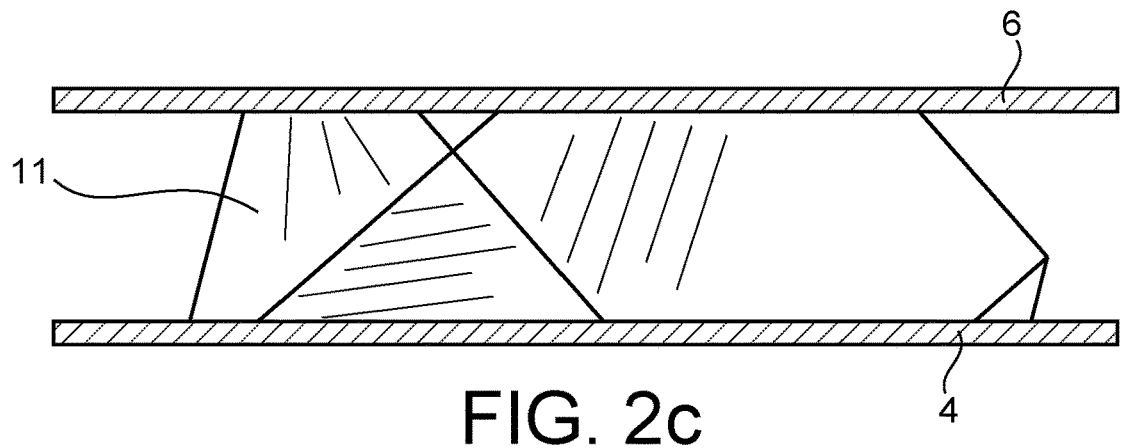
Figure 3A:
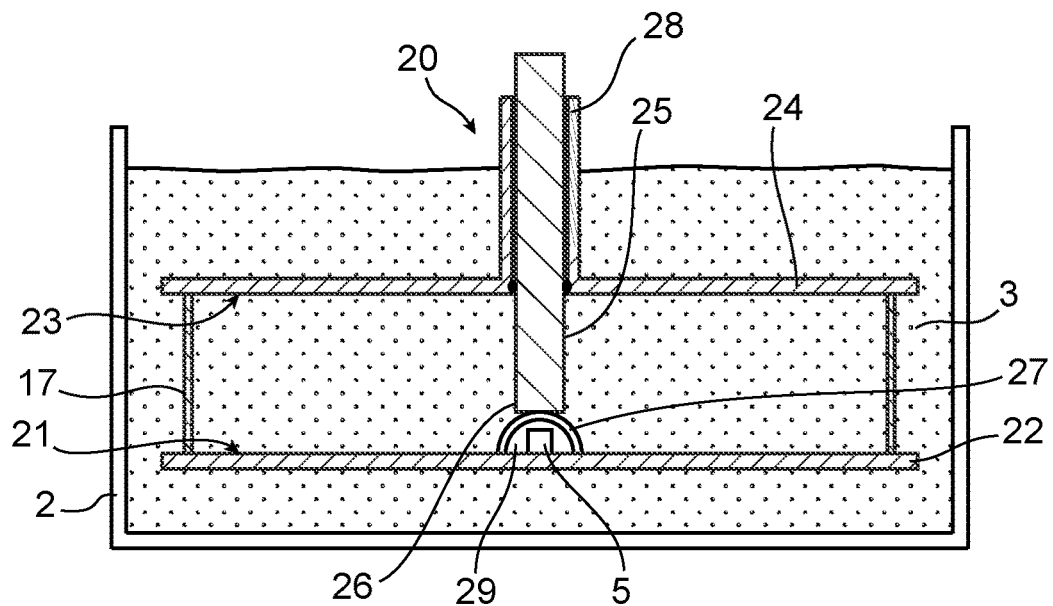
FIGS. 3a to 3c illustrate steps of the growth process according to the invention using the growth device according to the invention.
Figure 3B:
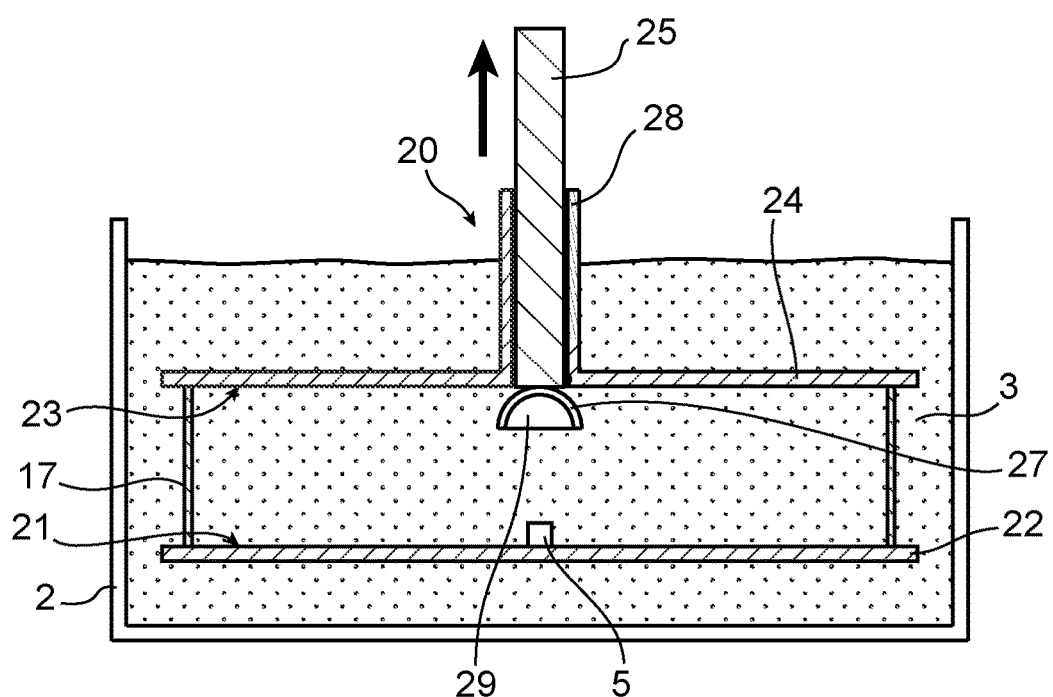
Figure 3C:
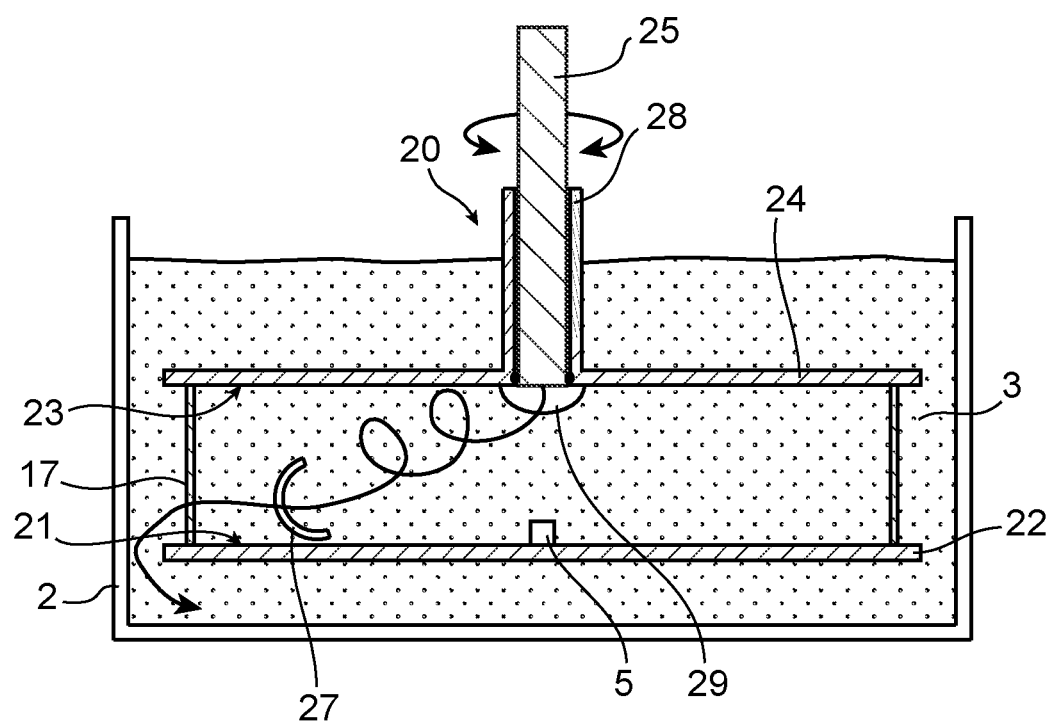

An example of possible configuration of the growth device 20 according to the invention is illustrated in FIGS. 3a to 3c.

Here, the support element 22 is in the form of a plate and forms the lower tray of a growth platform.

The blocking element 24 is also in the form of a plate, which forms the upper tray of the platform; the support element 22 and the blocking element 24 have their faces which are parallel.

The blocking element 24 is a plate including a through hole enabling the holding member to pass therethrough, which is here a rod 25 a planar-surface end 26 of which is for bearing against the protective member 27. Here, the plate-shaped blocking element 24 is further equipped with a hollow rotational shaft 28 which acts as a guide for the rod and in which the rod slides from its first position to its second position and vice-versa.

The support element 22 and the blocking element 24 are connected to each other by at least two connecting means, for example spacers 17, which enable both elements to be secured to each other and a predefined distance between the support face 21 and the blocking face 23 to be maintained. The support element 22, the blocking element 24 and the connecting means form a growth platform. Since these elements are connected to each other, it can be noted that the rotation of the support element 22 also causes the rotation of the blocking element and, finally, the rotation of the entire platform.

The seed 5 for the growth in solution is bound to the support face of the support element 22.

The seed protective member 27 is a shell which here has the form of a bell; it is positioned around the seed before the growth solution 3 is introduced in the vessel 2. Thus, the protective member 27 protects the seed 5 of the solution 3 by creating an air pocket 29 around the seed. The seed protective member 27 is held pressed against the support element 22 by the rod 25.

The seed 5 is released and contacted with the growth solution 3 by lifting the rod 25. The rod 25, the bottom end 26 of which is planar, forms a planar surface with the blocking element when it is lifted up to the level of the blocking element 24; the junction of the blocking element and of the planar end of the rod thereby forms the blocking face 23. The geometry of the growth device 20 according to the invention is therefore compatible with the production of plate-shaped single crystals obtained by blocking the growth by a plane located on top of the seed, forcing the crystal lateral growth.

When the rod 25 is lifted, the protective member 27 for the seed 5 is also lifted under the effect of the buoyant force and is upwardly driven upon lifting the rod 25 and releases the seed 5 (FIG. 3b).

In order to facilitate the protective member 27 for the seed 5 in bearing against the bottom end 26 of the rod 25, the protective member (herein, in the form of a bell) can have a flat on the apex of its external surface.

Under the effect of the simple or alternate rotation, applied to the support element about its axis of rotation (which passes through the shaft 28), the seed protective member topples. In view of the external shape of the seed protective member (bell), the simple or alternate rotation of the support element promotes its reversal and expelling to fall to the bottom of the growth vessel.

This topple effect can be amplified by slightly off-centring the protective member 25 with respect to the axis of rotation of the support element (which is most often located in the centre of the support element) upon being placed.

Once it is ejected, the buoyant force becomes lower than the gravity forces exerted on the seed protective member 27 and it flows down to be placed in the bottom of the growth vessel 2. It thus does not impede the crystal growth between the support element 22 and the blocking element 24 any longer (FIG. 3c).

Of course, the different elements making the device subject matter of the invention are made in materials compatible with the crystallisation solution, as well as the growth conditions for the single crystal.

CITED REFERENCES

[1] U.S. Pat. No. 5,904,772
[2] FR 2 764 909 B1

What is claimed is:

1. A growth device for growing a planar single crystal from a seed crystal in a crystallisation solution, the growth device comprising:
    a support element having a support face for supporting the seed crystal; and
    a blocking element comprising a blocking face, the blocking face being disposed at a predefined distance from the support face so as to block growth of the single crystal in a substantially perpendicular direction to the support face;
    wherein the growth device further comprises a protective member for protecting the seed crystal, configured to protect the seed from the crystallisation solution during a treatment phase of the crystallisation solution and to release a growth zone disposed between the support face and the blocking face upon rotating the support element;

the blocking element further including a holding member cooperating with the protective member, the holding member being movable between a first position in which it holds the protective member against the support face during the treatment phase and a second position in which the holding member is separated from the protective member and aids in forming the blocking face.

2. The device according to claim 1, wherein the protective member is a hollow body defining an open cavity for covering the seed during the treatment phase.

3. The device according to claim 1, wherein the blocking element includes a planar body a surface of which defines the blocking face, this body having a through hole which delimits an opening in the blocking face and wherein the holding member slides between the first and second positions.

4. The device according to claim 1, wherein the holding member is a rod an end of which is provided with a planar surface having a shape corresponding to that of the opening in the blocking face.

5. The device according to claim 1, wherein the protective member includes, on an external surface thereof, a flat forming a planar bearing surface against which the holding member bears in the first position.

6. The device according to claim 1, wherein the support face and the blocking face are parallel to each other.

7. A facility for growing in solution a single crystal, comprising a vessel for containing a crystallisation solution, a growth device according to claim 1, disposed in the vessel, and means for rotating the device in the vessel.

8. A process for manufacturing a single crystal by growth in solution from a seed crystal implemented using a facility according to claim 7, the process comprising:
fixing the seed crystal to the support face of the support element, the seed crystal being oriented according to the orientation of the desired single crystal;
placing the protective member around the seed and holding it on the support face of the support element by pressing on the protective member through the holding member, which is placed in its first position;
contacting the protective member with the crystallisation solution by dipping the device into the crystallisation solution;
treating the crystallisation solution to obtain an under-saturated solution;
contacting the seed with the under-saturated crystallisation solution by moving the holding member from its first position to its second position and rotating the device about an axis essentially perpendicular to the support face, moving of the holding element and rotating, which releases the protective member;
modifying the temperature of the growth solution to obtain an over-saturated solution;
growing the single crystal between the support face and the blocking face from the over-saturated solution, this growth being continued until a desired lateral growth is obtained;
detaching the single crystal from the support face and the blocking face.

9. The manufacturing process according to claim 8, wherein the single crystal is a single crystal of potassium dihydrogen phosphate (KDP) or deuterated potassium dihydrogen phosphate (DKDP).

* * * * *